(12) United States Patent
Camarota (10) Patent No.: US 10,177,107 B2
(45) Date of Patent: Jan. 8, 2019

(54) HETEROGENEOUS BALL PATTERN PACKAGE

(71) Applicant: Xilinx, Inc., San Jose, CA (US)

(72) Inventor: Rafael C. Camarota, San Jose, CA (US)

(73) Assignee: XILINX, INC., San Jose, CA (US)

( * ) Notice: Subject to any disclaimer, the term of this patent is extended or adjusted under 35 U.S.C. 154(b) by 38 days.

(21) Appl. No.: 15/225,550

(22) Filed: Aug. 1, 2016

(65) Prior Publication Data

US 2018/0033753 A1 Feb. 1, 2018

(51) Int. Cl.
*H01L 23/00* (2006.01)
*H01L 23/498* (2006.01)
*H01L 23/528* (2006.01)

(52) U.S. Cl.
CPC ........ *H01L 24/09* (2013.01); *H01L 23/49816* (2013.01); *H01L 23/49827* (2013.01); *H01L 23/49838* (2013.01); *H01L 23/5286* (2013.01); *H01L 24/17* (2013.01); *H01L 24/83* (2013.01); *H01L 2224/0903* (2013.01); *H01L 2224/0912* (2013.01); *H01L 2224/1712* (2013.01)

(58) Field of Classification Search
CPC . H01L 2224/06132; H01L 2224/09132; H01L 2224/14132; H01L 2224/17132; H01L 2224/33132; H01L 2224/30132
See application file for complete search history.

(56) References Cited

U.S. PATENT DOCUMENTS

| | | | | |
|---|---|---|---|---|
| 5,436,503 A | * | 7/1995 | Kunitomo | H01L 21/563 257/737 |
| 5,729,894 A | * | 3/1998 | Rostoker | G03F 7/70433 257/693 |
| 6,707,140 B1 | * | 3/2004 | Nguyen | H01L 23/49838 257/686 |
| 6,750,552 B1 | * | 6/2004 | Narayanan | H01L 21/563 257/707 |
| 7,123,480 B1 | * | 10/2006 | Andoh | H01L 23/3128 361/704 |
| 7,705,619 B2 | | 4/2010 | Kato et al. | |
| 8,674,505 B2 | | 3/2014 | Rhyner et al. | |
| 8,817,486 B2 | | 8/2014 | Kim et al. | |

(Continued)

FOREIGN PATENT DOCUMENTS

WO 2005091366 9/2005
WO 2013095544 6/2013

*Primary Examiner* — Michael Lebentritt
*Assistant Examiner* — Jordan M Klein
(74) *Attorney, Agent, or Firm* — Steven Roberts (57) ABSTRACT

Methods and apparatus are described for strategically arranging conductive elements (e.g., solder balls) of an integrated circuit (IC) package (and the corresponding conductive pads of a circuit board for electrical connection with the IC package) using a plurality of different pitches. One example integrated circuit (IC) package generally includes an integrated circuit die and an arrangement of electrically conductive elements coupled to the integrated circuit die. In at least one region of the arrangement, the conductive elements are disposed with a first pitch in a first dimension of the arrangement and with a second pitch in a second dimension of the arrangement, and the second pitch is different from the first pitch. The pitch of a given region may be based on mechanical, PCB routing, and/or signal integrity considerations.

22 Claims, 8 Drawing Sheets

(56) References Cited

U.S. PATENT DOCUMENTS

| | | | |
|---|---|---|---|
| 2003/0011071 A1* | 1/2003 | Kariyazaki | H01L 23/50 257/737 |
| 2004/0246691 A1* | 12/2004 | Budell | H01L 23/49838 361/767 |
| 2005/0007147 A1 | 1/2005 | Young | |
| 2005/0167798 A1 | 8/2005 | Doan | |
| 2006/0226527 A1 | 10/2006 | Hatano et al. | |
| 2007/0080456 A1* | 4/2007 | Chang | H01L 23/49816 257/738 |
| 2008/0029876 A1* | 2/2008 | Niu | H01L 23/49816 257/693 |
| 2008/0242121 A1* | 10/2008 | Browning | H01L 23/49838 439/65 |
| 2010/0244221 A1 | 9/2010 | Ko | |
| 2010/0327424 A1 | 12/2010 | Braunisch et al. | |
| 2011/0001230 A1* | 1/2011 | Li | H01L 23/3677 257/693 |
| 2012/0068350 A1* | 3/2012 | Kim | H01L 23/49811 257/773 |
| 2012/0106116 A1* | 5/2012 | Nakagawa | H01L 23/49838 361/808 |
| 2012/0241208 A1* | 9/2012 | Petersen | H01L 23/49838 174/266 |
| 2012/0248439 A1* | 10/2012 | Lee | H01L 23/49838 257/48 |
| 2015/0008575 A1* | 1/2015 | Liu | H01L 24/81 257/737 |
| 2015/0222033 A1 | 8/2015 | Wu et al. | |
| 2017/0005061 A1* | 1/2017 | Wang | H01L 23/49838 |

* cited by examiner

HETEROGENEOUS BALL PATTERN PACKAGE

TECHNICAL FIELD

Examples of the present disclosure generally relate to integrated circuits and, more particularly, to integrated circuit packaging using a heterogeneous pattern of conductive pads.

BACKGROUND

Many integrated circuits and other semiconductor devices utilize an arrangement of bumps, such as a ball grid array (BGA), for surface mounting packages to a circuit board (e.g., printed circuit board (PCB). Any of various suitable package pin structures, such as controlled collapse chip connection (C4) bumps or microbumps (as used in stacked silicon applications), may be used to conduct electrical signals between a channel on an integrated circuit (IC) die (or other package device) and the circuit board on which the package is mounted. However, in conventional packages, only a fraction of the available resources can be bonded out to the package pin structures, especially for the smallest package in which the IC die (or other device) fits, as explained below.

SUMMARY

One example of the present disclosure is an integrated circuit (IC) package. The IC package generally includes an integrated circuit die and an arrangement of electrically conductive pads coupled to the integrated circuit die. In at least one first region of the arrangement, the conductive pads are disposed with a first pitch in a first dimension of the arrangement and with a second pitch in a second dimension of the arrangement, and the second pitch is different from the first pitch.

Another example of the present disclosure is a circuit board for electrically connecting with an integrated circuit package. The circuit board generally includes an arrangement of electrically conductive pads, wherein in at least one first region of the arrangement, the conductive pads are disposed with a first pitch in a first dimension of the arrangement and with a second pitch in a second dimension of the arrangement, the second pitch being different from the first pitch in the first region; and a plurality of vias and traces coupled to the conductive pads.

Yet another example of the present disclosure is a method of packaging a semiconductor die. The method generally includes generating an arrangement of electrically conductive pads, wherein in at least one region of the arrangement, the conductive pads are disposed with a first pitch in a first dimension of the arrangement and with a second pitch in a second dimension of the arrangement, the second pitch being different from the first pitch; and electrically coupling the semiconductor die to the conductive pads.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Examples of the present disclosure provide techniques and apparatus for strategically arranging conductive elements (e.g., solder balls) of an integrated circuit (IC) package (and the corresponding conductive pads of a circuit board for electrical connection with the IC package) using a plurality of different pitches. Referred to herein as "heterogeneous ball pitch patterns," such strategic use of multiple pitches can increase the conductive element density without decreasing ease of use, compromising signal integrity, or compromising mechanical integrity for the customer tasked with designing the circuit board with breakouts for the arrangement of conductive pads and without increasing the layer count or complexity of the circuit board. Implementing IC packages with heterogeneous ball pitch patterns substantially increases the ball count (e.g., outside the die shadow), thereby increasing the ability to bond out more resources in a given package size. Furthermore, having full bond-out in the smallest package possible may substantially reduce the number of die package combinations supported.

Example Integrated Circuit Package

An integrated circuit (IC) die is typically disposed in a package for electrical connection with a circuit board (e.g., a printed circuit board (PCB)). The package protects the integrated circuit die from potential physical damage and moisture, which may lead to corrosion.

Figure 2:
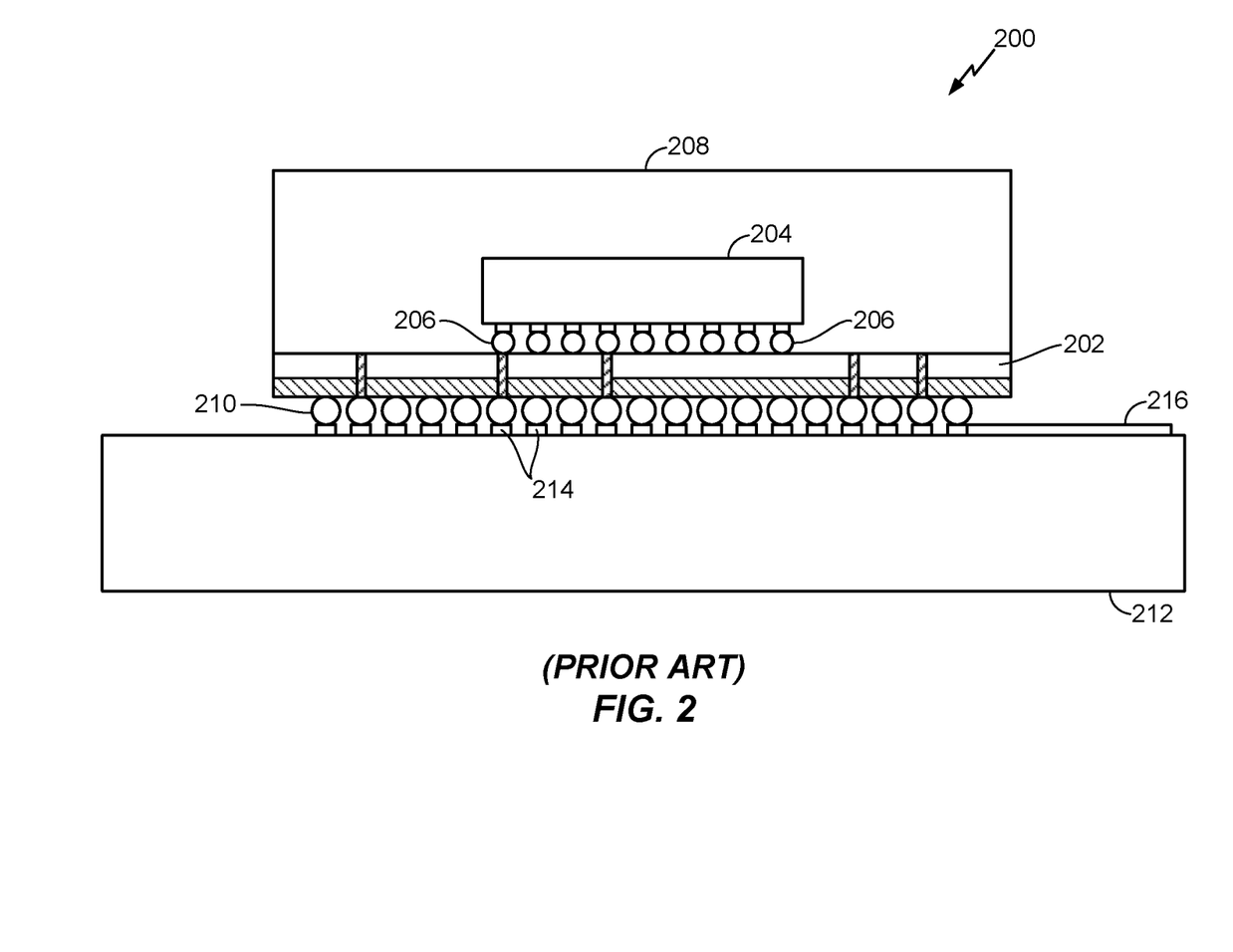
FIG. 2 is a cross-sectional view of an example integrated circuit (IC) package having an array of solder balls, in accordance with the prior art.

FIG. 2 is a cross-sectional view of an example IC package 200, known as a flip-chip ball grid array (FCBGA) package. The IC package 200 includes a substrate 202, an IC die 204 disposed above the substrate 202, a plurality of eutectic bumps 206 (e.g., C4 bumps), and an encapsulation material 208. The plurality of eutectic bumps 206 electrically connect the IC die 204 to the substrate 202, and more particularly to conductive elements on the surface of and vias in the substrate. The encapsulation material 208 may be any of various suitable substances (e.g., resin) for encapsulating and protecting the IC die 204.

The IC package 200 also has a plurality of solder balls 210 disposed below the substrate 202. The solder balls 210 may be arranged in an array of rows and columns for making electrical contact with a matching arrangement of conductive pads 214 disposed on a surface of a circuit board 212. The conductive pads 214 are electrically connected with other components disposed on a surface or in the circuit board 212, through the use of vias (not shown) and electrically conductive traces 216.

For other packages, such as ball grid array (BGA) packages, a plurality of bonding wires may be used instead of the eutectic bumps 206. In this case, the IC die 204 may be mounted face-side up such that the conductive elements are disposed on an upper surface of the IC die 204, and the bonding wires may electrically connect these conductive elements to the solder balls 210 through vias in the substrate 202.

Example Integrated Circuits

Many different types of integrated circuit (IC) die may be packaged in the package 200. One suitable type of IC is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, dock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application specific integrated circuits (ASICs).

Figure 1:
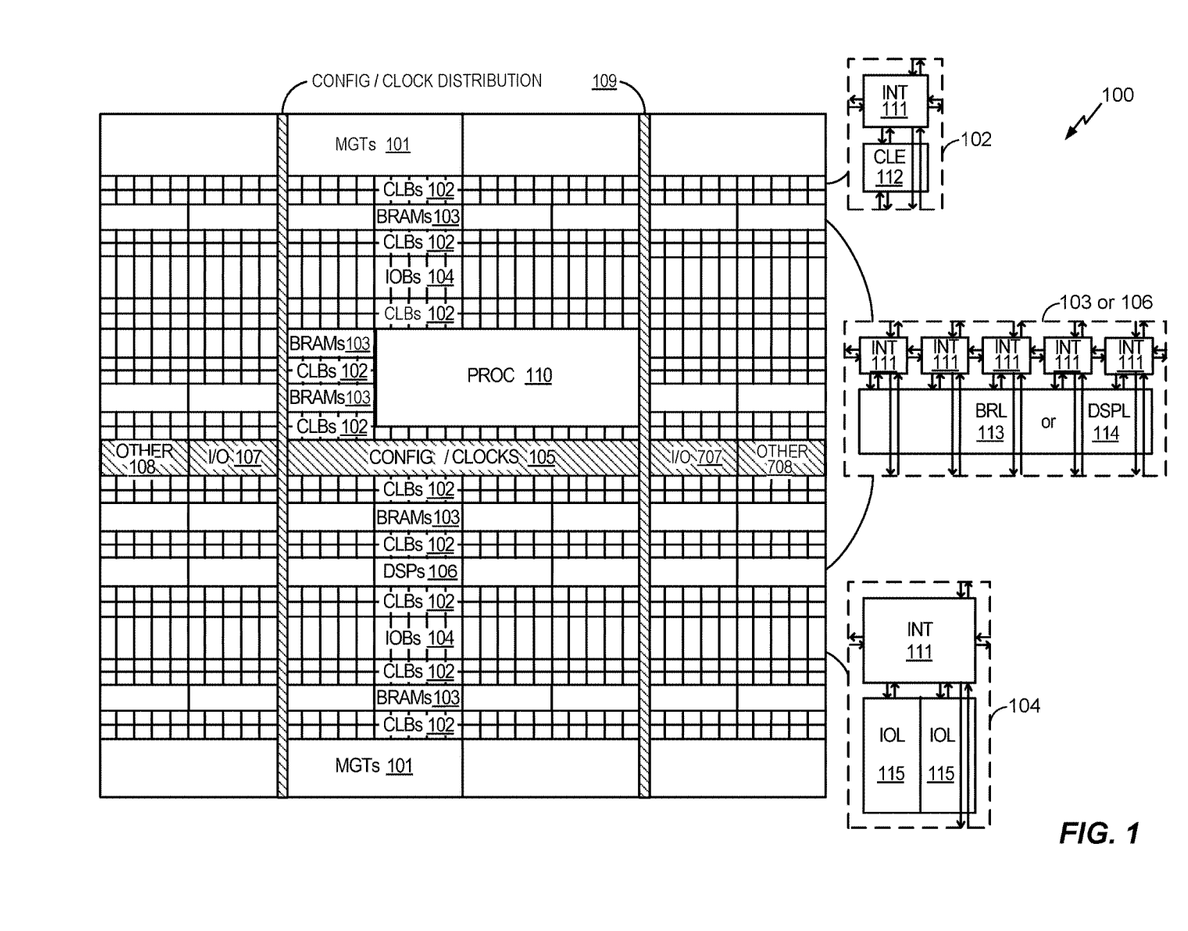
FIG. 1 is a block diagram illustrating an example architecture for a programmable device.

FIG. 1 is a block diagram illustrating an example architecture 100 for a programmable device, which may be implemented in the IC package 200 of FIG. 2. The architecture 100 may be implemented within a field programmable gate array (FPGA), for example. As shown, the architecture 100 includes several different types of programmable circuitry, e.g., logic, blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An IOB 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

Example Heterogeneous Pitch Patterns

Figure 3A:
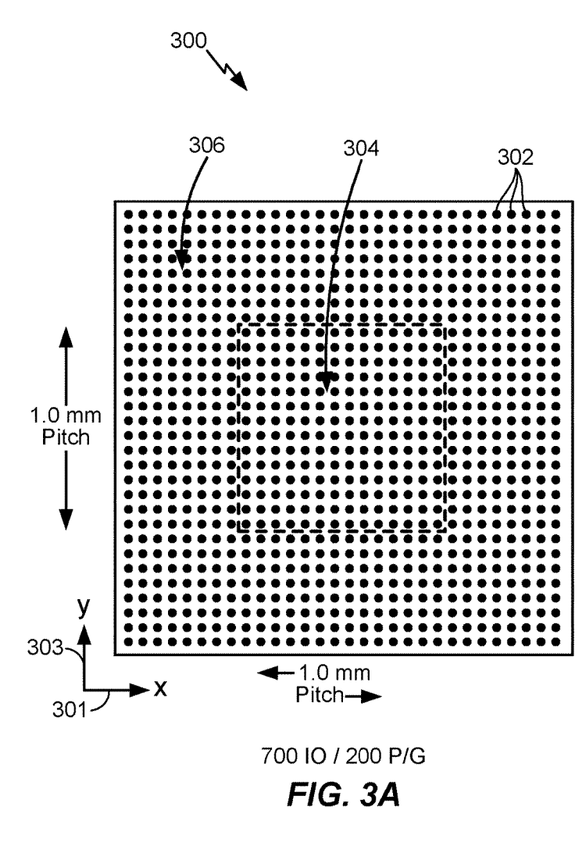
FIG. 3A is a bottom view of an example IC package having a homogeneous solder ball pitch pattern.

FIG. 3A is a bottom view of an example IC package 300 having a homogeneous solder ball pitch. As used herein, "homogeneous solder ball pitch" for a package surface or a particular region of the package surface generally refers to having the same solder ball pitch in two dimensions for that surface or region thereof. For example, the IC package 300 has the same pitch (e.g., 1.0 mm) between solder balls 302 for both the x dimension 301 and the y dimension 303 of the bottom planar surface of the package. In this example, the central region 304 of the IC package 300 may have solder balls (e.g., approximately 200 solder balls) designated for power and ground, which may be located under the IC die shadow, whereas the peripheral region 306 may have solder balls (e.g., about 700 solder balls) designated for I/O.

Currently, many IC dies in traditional packages can only bond out a fraction of the resources (e.g., input/output (I/O) and gigabit transceiver (GT) resources, as described above with respect to programmable ICs) in the smallest package into which the die fits. For many IC dies, there is no package using traditional homogeneous ball pattern packages that can bond out all the IO and GT resources, or a package with a smaller homogeneous ball pitch that allows the desired signal count may be beyond the breakout ability of conventional printed circuit board (PCB) technology.

Examples of the present disclosure provide a heterogeneous ball pattern package, in which multiple solder ball pitches are used. By strategically utilizing multiple pitches (e.g., 1.0 mm, 0.8 mm, and/or other pitches), it is possible to increase the number of resources (e.g., I/O and/or GT resources) that can be bonded out over traditional packages (e.g., up to 50% more). This increase in the number of resources that can be bonded out can be accomplished without making the package more difficult or costly for the circuit board designer to use or harder for the package manufacturer to fabricate. Examples of the present disclosure may provide a fully bonded die in the smallest (and lowest cost) package possible. This decreased package size reduces unit cost and decreases real estate occupied on a circuit board, thereby further reducing cost.

Figure 3B:
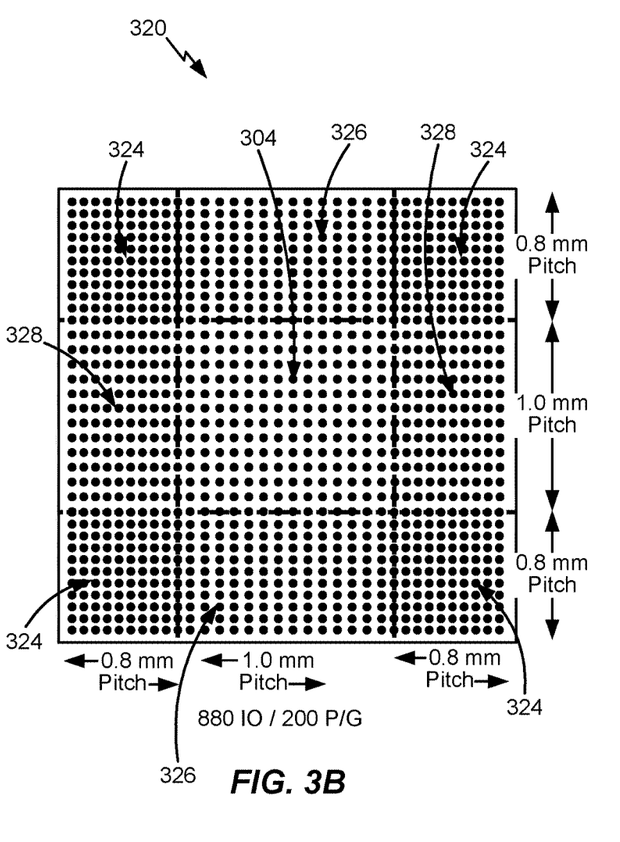
FIGS. 3B-3D are bottom views of example IC packages having heterogeneous solder ball pitch patterns, in accordance with examples of the present disclosure.

FIG. 3B is a bottom view of an example IC package 320 having a heterogeneous solder ball pitch pattern, in accordance with an example of the present disclosure. Although FIGS. 3A and 3B are described as the bottom view of example IC packages, both figures (as well as FIGS. 3C, 3D, and 5) may also be considered as representing a top (or bottom) view of a circuit board, where the illustrated solder balls represent conductive pads for making electrical contact with the solder balls of an IC package. The corresponding conductive pads would be arranged in a pattern matching the solder ball pattern. As used herein, "heterogeneous solder ball pitch" for a package surface or a particular region of the package surface generally refers to having multiple solder ball pitches for that surface or region thereof. For example, a region may use one pitch in one dimension and a different pitch in another dimension. For some examples, other regions on the same package surface may use a homogeneous solder ball pitch.

For example, the central region 304 under the IC die shadow may use a homogeneous pitch pattern (e.g., a pitch of 1.0 mm in both dimensions) in the heterogeneous pattern package, and the corner regions 324 of the IC package 320 may also have a homogeneous pitch pattern (e.g., a pitch of 0.8 mm in both dimensions), as illustrated. In other words, the regions 304 and 324 may be homogeneous pitch pattern regions as part of the overall heterogeneous pitch pattern for the IC package 320. For other examples as illustrated in another example IC package 340 of FIG. 3C, the central region 344 under the IC die shadow may use a smaller homogenous pitch pattern (e.g., a pitch smaller than 0.8 mm in both dimensions). Since no substantial routing is involved in this area for the corresponding circuit board other than dropping a via to a power or ground plane, this central region 344 under the IC die shadow may have the lowest pitch possible (i.e., the highest ball density possible). This pitch may be limited by the greater of the realizable "mechanical limit" (set by the ball-to-ball space after soldering, which is based on the ball size) and the "via limit" (determined by the diameter of a via and a minimum distance between the via and a conductive pad on either side). Although 0.8 mm and 1.0 mm pitches are used throughout the present disclosure, these represent example pitches for illustrating the use of different pitches in a heterogeneous pitch pattern; any of various other suitable pitches meeting certain criteria described herein may be used additionally or alternatively.

Figure 3C:
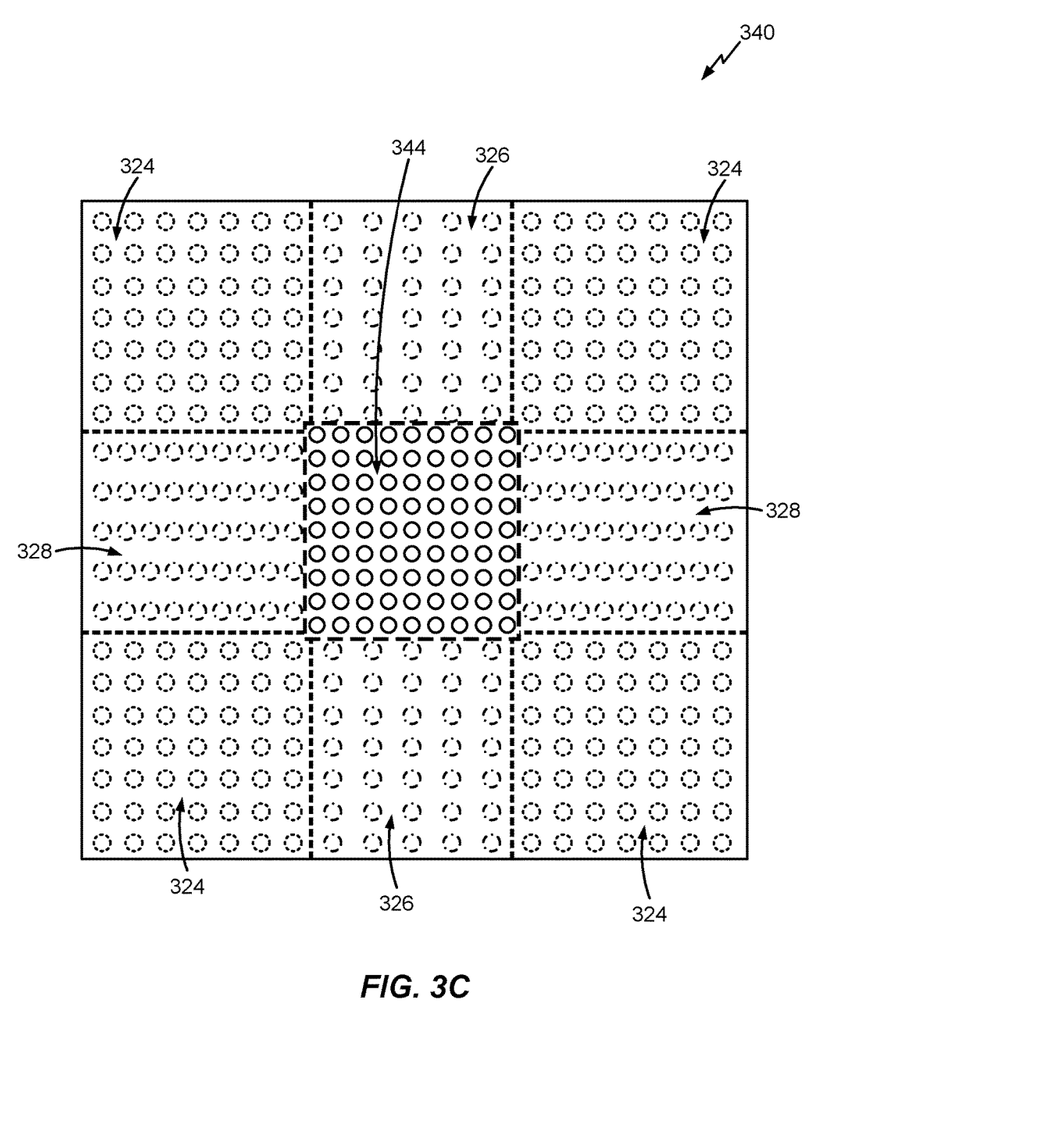
Figure 4A:
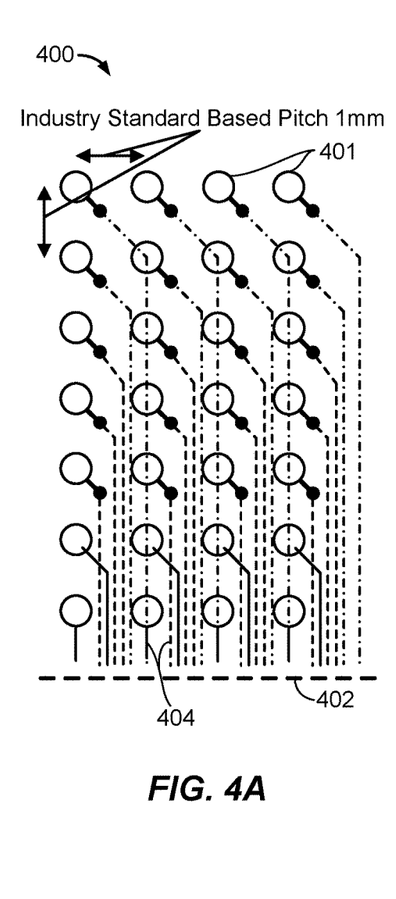
FIGS. 4A and 4B are example circuit board breakouts for homogeneous and heterogeneous conductive pad pitch patterns, respectively, in accordance with an example of the present disclosure.
Figure 4B:
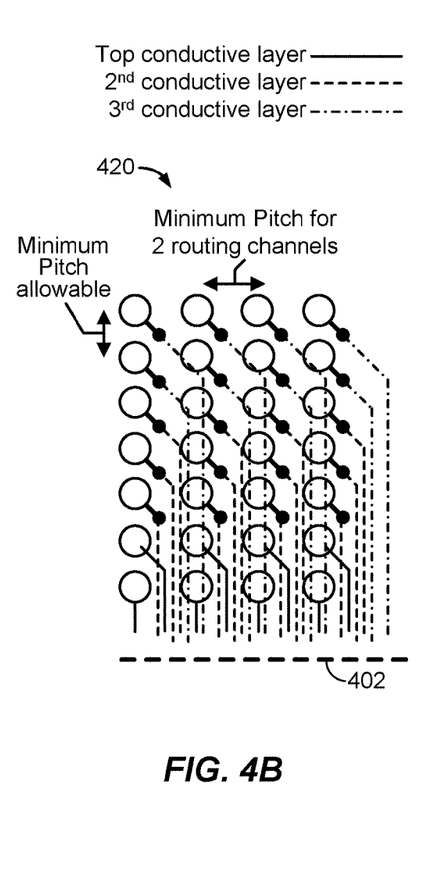
Figure 4C:
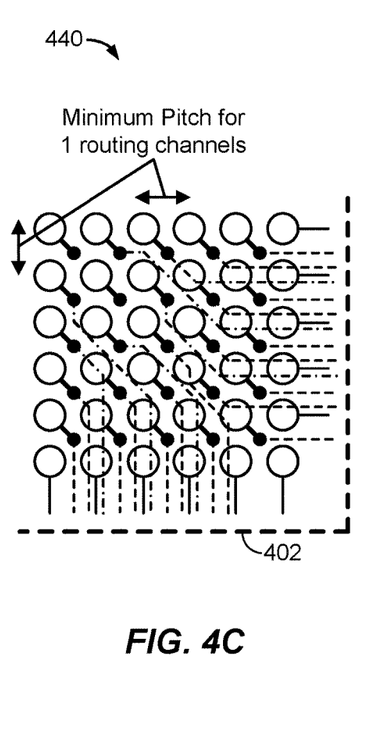
FIG. 4C is an example circuit board breakout for a corner region of a heterogeneous conductive pad arrangement with a homogeneous pitch pattern in this corner region, in accordance with an example of the present disclosure.

As illustrated in FIG. 4C, the corner regions 324 of the IC package 320 (or 340)—and, more particularly, the corresponding corner regions in the conductive pad arrangement on a circuit board—may entail routing one x-dimension and one y-dimension trace per circuit board layer. Thus, the pitch of the corner regions 324 may be limited by the maximum of the mechanical limit, the via limit, and the "one-route limit" (the minimum spacing between vias that allows a single minimum width trace between the vias, which is designated as "minimum pitch for 1 routing channels" in FIG. 4C). Therefore, the corner regions 324 of the IC package 320 (or 340) and the corresponding circuit board arrangement may use a pitch of 0.8 mm, for example, in both dimensions.

Returning to FIG. 3B (or 3C), other regions of the IC package 320 (or 340) may use a heterogeneous pitch pattern. For example, the two lateral regions 326 have a particular solder ball pitch (e.g., of 1.0 mm) in the x dimension 301 and a smaller pitch (e.g., of 0.8 mm) in the y dimension 303, whereas the two lateral regions 328 have a certain solder ball pitch (e.g., of 0.8 mm) in the x dimension 301 and a larger pitch (e.g., of 1.0 mm) in the y dimension 303. In the IC package 320 (which has the same surface area on the bottom as the IC package 300 of FIG. 3A), the central region 304 still has about 200 solder balls, which may be designated for power and ground. However, by strategically decreasing the ball pitch in particular regions of the IC package 320, the ball density outside the central region 304 has been increased, providing about 880 solder balls, which may be designated for I/O.

As illustrated in FIG. 4B described below, the lateral regions 326, 328 of the IC package—and, more particularly, the corresponding lateral regions in the conductive pad arrangement on a circuit board—may entail routing up to two traces per circuit board layer perpendicular to the edge 402 of the IC package. Thus, the pitch of the lateral regions 326, 328 parallel to the edge 402 of the IC package may be limited by the maximum of the mechanical limit, the via limit, and the "two-route limit" (the minimum spacing between vias that allows two minimum width traces between the vias, which is designated as "minimum pitch for 2 routing channels" in FIG. 4B). The pitch of the lateral regions 326, 328 perpendicular to the edge 402 of the IC package may be limited by the maximum of the mechanical limit and the via limit (designated as "minimum pitch allowable" in FIG. 4B).

In some cases when high-speed or highly sensitive analog signals are used, the pitches of solder balls in certain regions of the IC package (e.g., the corner and lateral regions) or in the corresponding conductive pad arrangement on the circuit board may be limited by a "signal-to-noise ratio (SNR) limit." The SNR limit is set based on the knowledge that coupling between the conductive pads is inversely proportional to distance between the pads.

Figure 3D:
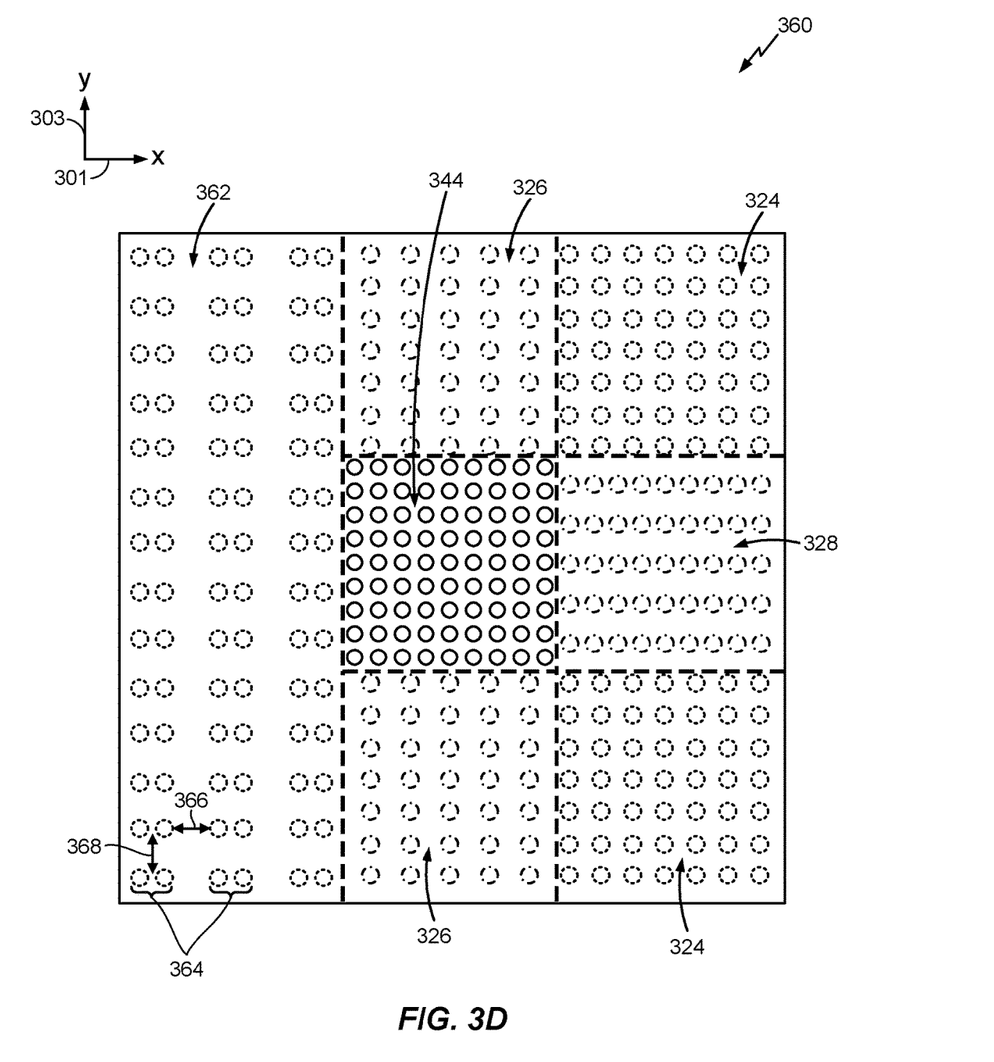

For example, FIG. 3D is a bottom view of an example IC package 360 having a heterogeneous solder ball pitch pattern in which the SNR limit has been invoked, in accordance with an example of the present disclosure. Region 362 includes multiple differential pairs 364 of solder balls, where the pitch 366 in the x dimension 301 between differential pairs 364 is based on a first SNR limit and where the pitch 368 in the y dimension 303 between differential pairs 364 is based on a second SNR limit. The first and second SNR limits may be the same or different. As illustrated in FIG. 3D, the SNR limit may be greater than the two-route limit, the one-route limit, the via limit, and the mechanical limit, as described above.

There are several reasons to use a heterogeneous ball pattern package as described herein. Signals routed under the shadow of the die (especially GT signals) may be affected by power planes of the IC die (e.g., FPGA power planes). Larger power planes may make routing under the die increasingly difficult. Therefore, such signals (e.g., high performance GT signals) may be routed by avoiding the shadow under the IC die on the package substrate. Moreover, a heterogeneous ball pattern package may provide a substantial increase (e.g., by 50%) in ball count used for functional I/O that is not under the die (e.g., due to a 40% decrease in pitch). Furthermore, power and/or ground pins may have the tightest pitch possible.

Strategic use of multiple pitches can increase the ball density without decreasing ease of use for a circuit board designer or other customer of the IC package. The ease of use is a function of pitch parallel to the edge of the package, whereas pitch perpendicular to the package edge does not impact circuit board routability. This strategic use of multiple pitches may also be based on the reliability of the IC package and on the signal integrity of the I/O pins. At least some of these factors may be taken into account when designing the IC package with a heterogeneous ball pattern, for example, balancing increased ball density against reliability and signal integrity.

FIG. 4A is an example circuit board breakout 400 for a homogeneous conductive pad pitch pattern, using 1.0 mm pitch between conductive pads 401 in both dimensions, as an example. FIG. 4B is an example circuit board breakout 420 for a heterogeneous conductive pad pitch pattern. The arrangement of conductive pads uses the minimum pitch for routing two traces per layer between the channels defined by the vias (e.g., a pitch of 1.0 mm) between conductive pads disposed in a direction parallel to the edge 402 of the IC package (that is, or would be, soldered to the conductive pads 401). However, this arrangement uses a smaller pitch (e.g., the minimum pitch allowable, such as 0.8 mm) between conductive pads disposed in a direction perpendicular to the edge 402. In this manner, both breakouts 400, 420 use the same number of circuit board layers (e.g., three layers) to route traces 404 away from the conductive pads 401 on the various layers. However, the heterogeneous conductive pad pitch arrangement uses 80% of the area of the homogeneous arrangement, for the same pad count (e.g. same I/O count). FIG. 4C is an example circuit board breakout 440 for a corner region (e.g., corner regions 324 of FIG. 3B or 3C) with a homogeneous conductive pad pitch, using the minimum pitch for routing one trace per layer between the via-defined channels (e.g., a pitch of 0.8 mm) between conductive pads in both dimensions, as an example.

Figure 5:
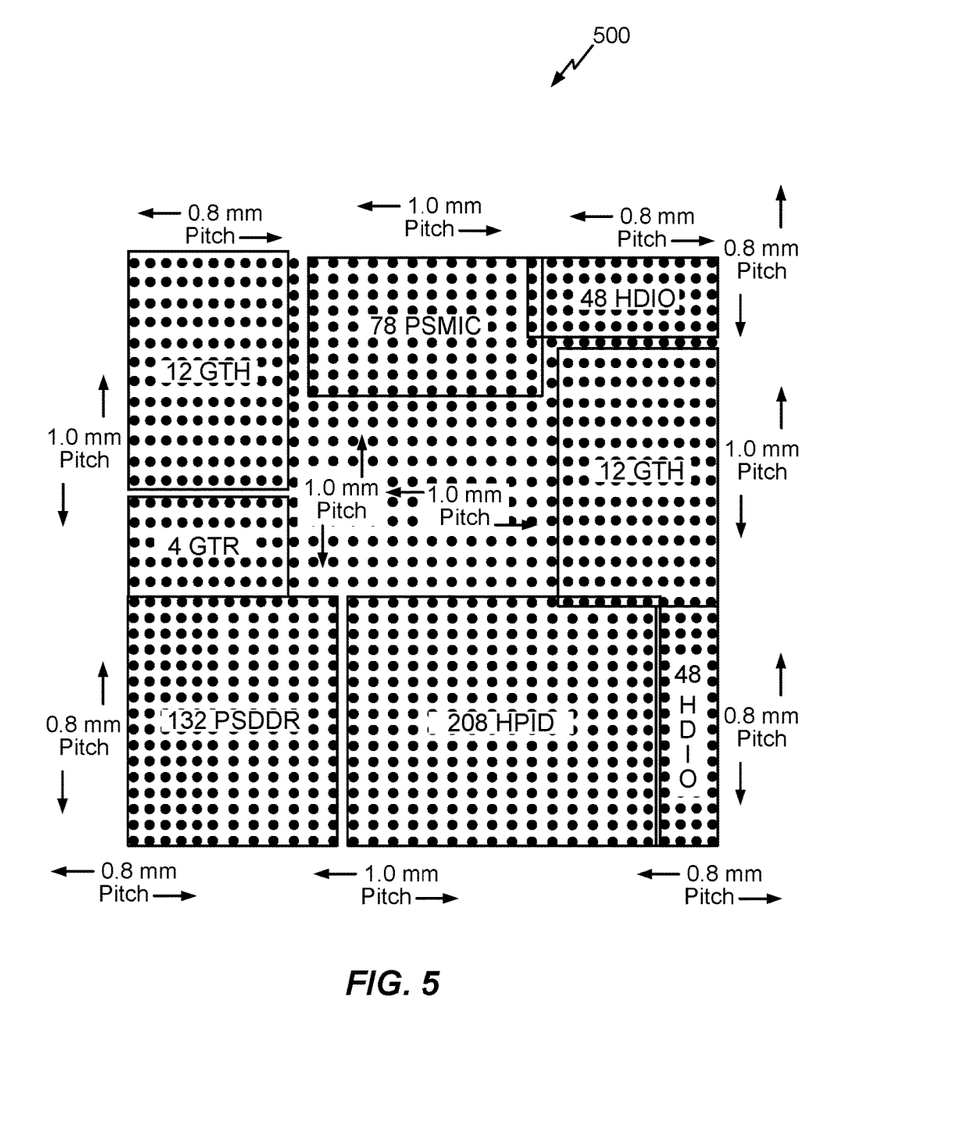
FIG. 5 is a bottom view of an example IC package having heterogeneous solder ball pitch, where different ball pitch regions have been assigned to different signal types, in accordance with an example of the present disclosure.

FIG. 5 is a bottom view of another example IC package 500 having a heterogeneous solder ball pitch pattern, in accordance with an example of the present disclosure. In the IC package 500, different ball pitch regions have been assigned to different signal types, and the solder ball pitch in each dimension has been selected accordingly. For example GT signals (carrying signals at data rates up to 32 gigabits per second (Gbps), for example) may be more sensitive to the ball pattern and benefit from a larger pitch, whereas the I/O signals (e.g., the high density I/O (HDIO) signals) are much less sensitive and can be used with smaller pitch. The example IC package 500 provides about 660 I/O balls, 290 GT balls, 120 power and ground (P/G) balls, and 58 guard ring (GR) balls. The IC package 500 is the same size as the IC package 300 of FIG. 3A (e.g., 31 mm package), but provides 1128 solder balls as compared to 900 solder balls. Therefore, by strategically implementing different pitch patterns with one or more pitches in different regions in accordance with example of the present disclosure, many more resources can be bonded out of an IC die for the same size package.

Example Operations for Packaging a
Semiconductor Die

Figure 6:
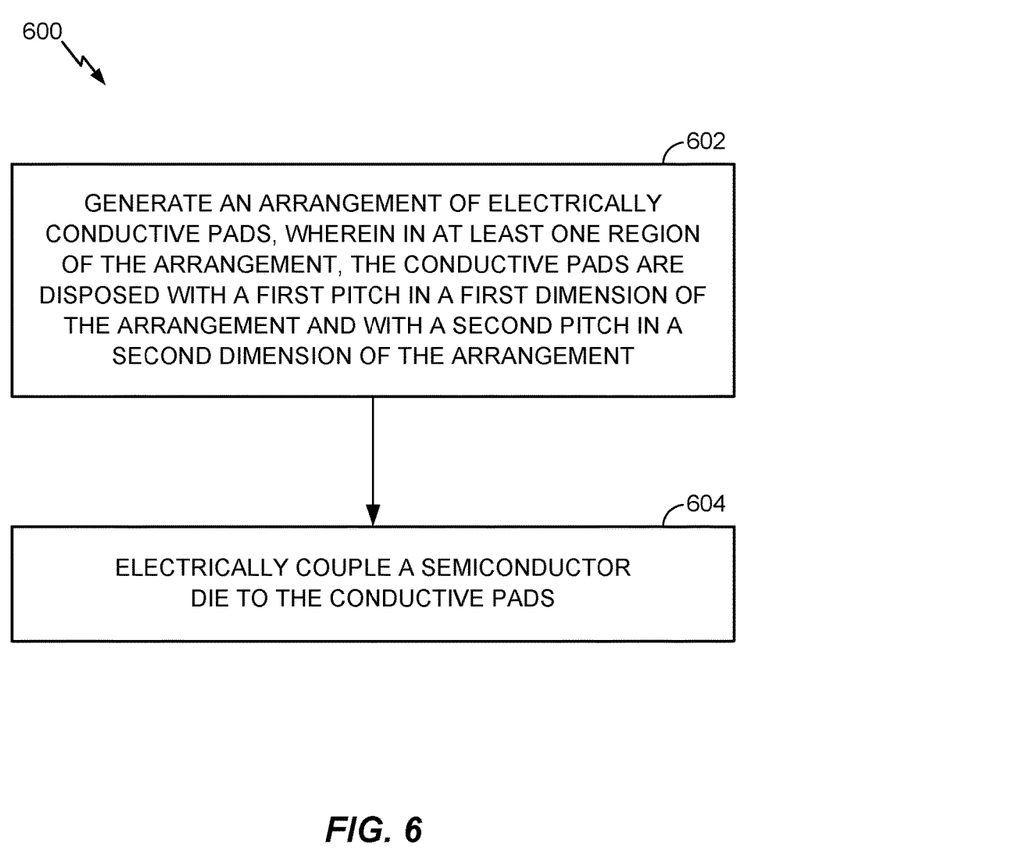
FIG. 6 is a flow diagram of example operations for packaging a semiconductor die, in accordance with an example of the present disclosure.

FIG. 6 is a flow diagram of example operations 600 for packaging a semiconductor die, in accordance with an example of the present disclosure. The operations 600 may be performed, for example, by an apparatus for fabricating the die package.

The operations 600 may begin, at block 602, with the apparatus generating an arrangement of electrically conductive pads. In at least one region of the arrangement, the conductive pads are disposed with a first pitch in a first dimension of the arrangement and with a second pitch in a second dimension of the arrangement. The second pitch is different from the first pitch. At block 604, the apparatus electrically couples the semiconductor die to the conductive pads (e.g., by attaching bonding wires between the die and the conductive pads or by depositing eutectic bumps on the die, flipping the die such that the eutectic bumps are mated with a matching arrangement of conductive elements on a substrate for the package, and flowing the eutectic bumps).

As described above, another example of the present disclosure is an IC package. The IC package generally includes an integrated circuit die and an arrangement of electrically conductive pads coupled to the integrated circuit die. In at least one first region of the arrangement, the conductive pads are disposed with a first pitch in a first dimension of the arrangement and with a second pitch in a second dimension of the arrangement, and the second pitch is different from the first pitch.

According to some examples, the pitch of the at least one first region is based on at least one of mechanical, circuit board routing, or signal integrity considerations.

According to some examples, the first dimension is perpendicular to the second dimension.

According to some examples, the first dimension is parallel to an edge of the package. In this case, the second pitch may be smaller than the first pitch. For example, the first pitch may be 1.0 mm, and the second pitch may be 0.8 mm. The larger pitch may be used to accommodate breakout routing, and the smaller pitch can be used because there is no routing parallel to the edge of the package.

According to some examples, in at least a second region of the arrangement, the conductive pads are disposed with a third pitch (e.g., in both the first dimension and the second dimension). For some examples, the third pitch may be equal to the first pitch, and the second pitch may be smaller than the first pitch. In this case, the second region may be located in a shadow of the integrated circuit die. For other examples, the third pitch may be equal to the second pitch, and the second pitch may be smaller than the first pitch. In this case, the second region may be located in a corner of the arrangement. For still other examples, the third pitch is different from the first pitch and the second pitch. For example, the third pitch may be smaller than the second pitch, and the second pitch may be smaller than the first pitch. In this case, the second region may be located in a shadow of the integrated circuit die.

According to some examples, in corner regions of the arrangement, the conductive pads are disposed with a third pitch in both the first dimension and the second dimension. The third pitch may be equal to the first pitch, equal to the second pitch, or different from both the first and second pitches.

According to some examples, the electrically conductive pads comprise solder balls. For some examples, the solder balls have the same diameter. For other examples, the solder balls in the first region have a different diameter than solder balls in a second region of the arrangement, different from the first region.

According to some examples, the first region is outside a shadow of the integrated circuit die.

Yet another example of the present disclosure is a circuit board for electrically connecting with an integrated circuit package. The circuit board generally includes an arrangement of electrically conductive pads, wherein in at least one first region of the arrangement, the conductive pads are disposed with a first pitch in a first dimension of the arrangement and with a second pitch in a second dimension of the arrangement, the second pitch being different from the first pitch in the first region; and a plurality of vias and traces coupled to the conductive pads.

According to some examples, the first dimension is parallel to an edge of the arrangement. In this case, the second pitch may be smaller than the first pitch. For example, the first pitch may be 1.0 mm, and the second pitch may be 0.8 mm.

According to some examples, in at least a second region of the arrangement, the conductive pads are disposed with a third pitch (e.g., in both the first dimension and the second dimension). For some examples, the second pitch may be smaller than the first pitch, the third pitch may be equal to the first pitch, the first region may be located along an edge of the arrangement, and/or the second region may be located closer to the center of the arrangement than the first region. For other examples, the second pitch may be smaller than the first pitch, the third pitch may be equal to the second pitch, and/or the second region may be located in a corner of the arrangement. For still other examples, the third pitch may be different from the first pitch and the second pitch. For example, the third pitch may be smaller than the second pitch, and the second pitch may be smaller than the first pitch. In this case, the second region may be located in the center of the arrangement.

According to some examples, in corner regions of the arrangement, the conductive pads may be disposed with a third pitch in both the first dimension and the second dimension.

According to some examples, the first dimension may be perpendicular to the second dimension.

As described above, strategic use of multiple pitches can increase the ball density without decreasing ease of use. Heterogeneous ball pitch substantially increases the ball count outside the die shadow, thereby increasing the ability to bond out more resources (e.g., GT resources) in a given package size. Furthermore, having full bond-out in the smallest package possible may substantially reduce the number of die package combinations supported. Traditional package limitations previously led to multiple package options (e.g., high I/O, high GT, balanced I/O and GT, etc.). Having fewer packages may save on development time and backend costs such as load board, burn-in boards, characterization boards, and the like.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. An integrated circuit package comprising:
   an integrated circuit die; and
   an arrangement of electrically conductive pads coupled to the integrated circuit die, wherein in at least one first region of the arrangement, the conductive pads are disposed with a first pitch in a first dimension of the arrangement and with a second pitch in a second dimension of the arrangement, the second pitch being different from the first pitch, and wherein in at least one corner region of the arrangement, the conductive pads are disposed with a third pitch in both the first dimension and the second dimension.

2. The package of claim 1, wherein the first dimension is parallel to an edge of the package and wherein the second pitch is smaller than the first pitch.

3. The package of claim 2, wherein the first pitch is 1.0 mm and wherein the second pitch is 0.8 mm.

4. The package of claim 1, wherein in at least a second region of the arrangement, the conductive pads are disposed with a fourth pitch in both the first dimension and the second dimension.

5. The package of claim 4, wherein the fourth pitch is different from the first pitch and the second pitch.

6. The package of claim 5, wherein the fourth pitch is smaller than the second pitch and wherein the second pitch is smaller than the first pitch.

7. The package of claim 6, wherein the second region is located in a shadow of the integrated circuit die.

8. The package of claim 4, wherein the fourth pitch is equal to the second pitch and wherein the second pitch is smaller than the first pitch.

9. The package of claim 8, wherein the second region is located in a corner of the arrangement.

10. The package of claim 1, wherein the electrically conductive pads comprise solder balls.

11. The package of claim 10, wherein the solder balls in the first region have a different diameter than solder balls in a second region of the arrangement, different from the first region.

12. The package of claim 1, wherein the first region is outside a shadow of the integrated circuit die.

13. A circuit board for electrically connecting with an integrated circuit package, the circuit board comprising:
  an arrangement of electrically conductive pads, wherein
    in at least one first region of the arrangement, the conductive pads are disposed with a first pitch in a first dimension of the arrangement and with a second pitch in a second dimension of the arrangement, the second pitch being different from the first pitch in the first region, and wherein in at least one corner region of the arrangement, the conductive pads are disposed with a third pitch in both the first dimension and the second dimension; and
  a plurality of vias and traces coupled to the conductive pads.

14. The circuit board of claim 13, wherein the first dimension is parallel to an edge of the arrangement and wherein the second pitch is smaller than the first pitch.

15. The circuit board of claim 13, wherein in at least a second region of the arrangement, the conductive pads are disposed with a fourth pitch in both the first dimension and the second dimension.

16. The circuit board of claim 15, wherein the second pitch is smaller than the first pitch, wherein the fourth pitch is equal to the first pitch, wherein the first region is located along an edge of the arrangement, and wherein the second region is located closer to the center of the arrangement than the first region.

17. The circuit board of claim 15, wherein the second pitch is smaller than the first pitch, wherein the fourth pitch is equal to the second pitch, and wherein the second region is located in a corner of the arrangement.

18. The circuit board of claim 15, wherein the second region is located in the center of the arrangement.

19. An integrated circuit package comprising:
  an integrated circuit die; and
  an arrangement of electrically conductive pads coupled to the integrated circuit die, wherein:
    in at least one first region of the arrangement, the conductive pads are disposed with a first pitch in a first dimension of the arrangement and with a second pitch in a second dimension of the arrangement, the second pitch being smaller than the first pitch; and
    in at least a second region of the arrangement, the conductive pads are disposed with a third pitch in both the first dimension and the second dimension, the third pitch being smaller than the second pitch.

20. The package of claim 19, wherein the second region is located in a shadow of the integrated circuit die.

21. An integrated circuit package comprising:
  an integrated circuit die; and
  an arrangement of electrically conductive pads coupled to the integrated circuit die, wherein:
    in at least one first region of the arrangement, the conductive pads are disposed with a first pitch in a first dimension of the arrangement and with a second pitch in a second dimension of the arrangement, the second pitch being smaller than the first pitch;
    in at least a second region of the arrangement, the conductive pads are disposed with a third pitch in both the first dimension and the second dimension; and
    the third pitch is equal to the second pitch.

22. The package of claim 21, wherein the second region is located in a corner of the arrangement.

* * * * *